United States Patent [19]

Sikes et al.

[11] Patent Number: 5,464,475
[45] Date of Patent: Nov. 7, 1995

[54] WORK-IN-PROCESS STORAGE POD

[75] Inventors: Roger A. Sikes; Alexander P. Plevich, both of Austin, Tex.

[73] Assignee: Advanced Micro Devices, Inc., Austin, Tex.

[21] Appl. No.: 246,830

[22] Filed: May 20, 1994

[51] Int. Cl.⁶ .................................................. C23C 16/00
[52] U.S. Cl. ............................ 118/719; 118/715; 454/187
[58] Field of Search ...................... 118/715, 719; 454/187; 312/31.1, 31.2, 223.2

[56] References Cited

U.S. PATENT DOCUMENTS

| 4,205,623 | 6/1980 | Mahl | 118/715 |
| 5,139,459 | 8/1992 | Takahashi | 454/187 |

OTHER PUBLICATIONS

G. J. Horky IBM Technical Disclosure Bulletin vol. 19 No. 12 May 1977.

*Primary Examiner*—Robert Kunemund
*Assistant Examiner*—Jeffrie R. Lund
*Attorney, Agent, or Firm*—Foley & Lardner

[57] ABSTRACT

An improved machine for performing a manufacturing process on a workpiece. The machine includes a cabinet defining an interior workspace for performing the manufacturing process. The workpiece is placed in the workspace by an operator. The cabinet is coupled with a gas source for receiving a flow of gas from the gas source. The improvement comprises a first aperture in the cabinet providing access to an interior chamber within the cabinet. The interior chamber has an interior surface and an open end aligned with the first aperture for storing a work-in-process unit. The interior chamber is accessible to the operator for transferring the work-in-process unit between the interior chamber and the workspace. The improvement further comprises a second aperture in the interior surface of the interior chamber, the second aperture admitting the flow of gas from the gas source to establish a laminar flow of the gas in the chamber intermediate the first aperture and the second aperture.

8 Claims, 3 Drawing Sheets

WORK-IN-PROCESS STORAGE POD

BACKGROUND OF THE INVENTION

The present invention is generally directed to a storage pod for storing work-in-process in a machine in a location readily accessible to an operator of the machine. The present invention is more particularly directed to an improved machine having a storage pod for storing work-in-process such as semiconductor wafers and providing a laminar flow of air through the storage pod and across the semiconductor wafers.

Semiconductor wafers are generally fabricated in a plurality of processing steps. These processing steps may include, for example, deposition of layers such as photoresist, ion implantation, diffusion, and etching. Each of these steps occurs in a different piece of processing equipment, known as a tool, such as an etcher or a furnace.

Between these processing steps, the semiconductor wafers are transported from one tool to another. The wafers are generally maintained in a storage device known as a cassette. The cassette may be a rack or frame which supports a number of wafers, for example 25 wafers. The cassette contacts only the edges of the wafers and maintains them in non-touching relation.

An important goal in transportation and storage of semiconductor wafers is prevention of contamination and damage to the wafers. Therefore, wafers are preferably maintained in an environment having an extremely low atmospheric particulate concentration. For example, processing equipment generally is kept in a clean room, which may be a class 10 clean room, meaning there are fewer than 10 particles 0.5 micron or larger in size per cubic meter of clean room air. Localized processing areas, including the tools where processing steps occur within the clean room, may have even lower particulate counts. Some areas may be, for example, class 1 areas. Particulate counts may be decreased in these areas by providing a laminar flow of filtered air through the area. It is desirable to store and transport wafers in the cleanest environment possible to reduce the risk of contamination.

Between processing steps, semiconductor wafers have heretofore been stored on shelves or in racks within the clean room. The shelves or racks have been located on the floor in the clean room or in the aisles between processing equipment. Storing work-in-process in this manner is inconvenient, since an operator seeking to move wafers between a processing tool and the storage area must physically carry the wafers, including the cassette or other storage device, the distance between the storage area and the tool. In addition to the inconvenience, this handling increases the likelihood of wafer damage or contamination. Moreover, storage of wafers in aisles adjacent to operator walkways and work areas also increases the risk of wafer damage and contamination, for example by inadvertent jostling of a storage rack by a passing operator.

When transporting semiconductor wafers between work areas, and between storage areas and work areas, the wafers have heretofore been stored in storage containers such as wafer boxes. These prior art wafer boxes have included a hinged top or lid which may be latched to secure a plurality of wafers carried on one or more wafer cassettes within the wafer box. The top or lid includes a handle for carrying the wafer box between work and storage areas.

Such prior art wafer storage containers have exhibited several limitations. Because the wafers or wafer cassettes stored within the container are accessible only by opening the top or lid and lifting the wafers or cassettes vertically out of the container, the container may only be used on an open shelf. The shelf must have sufficient vertical clearance above the container to allow the lid to open and the wafers or cassettes to be withdrawn or inserted. In addition, the vertical motion of withdrawing or inserting wafers or cassettes in the container from above may be ergonomically difficult for an operator transferring wafers or cassettes between a work area and the container.

Moreover, including a carrying handle on the top or lid of the storage container creates additional ergonomic problems for an operator transporting the storage container. A wafer storage container holding wafers and wafer cassettes may weigh 10–20 pounds. A single handle on the lid of the container requires that the container be carried in a single hand, putting great stress on the operator's arm, shoulder and back. In addition, supporting the entire container and its contents by a handle connected to the hinged lid requires that the hinges and latches which couple the lid to the body of the container support the entire weight of the container and its contents. This has required heavy duty hinges, latches and other hardware.

Accordingly, there is a need in the art for a work-in-process storage pod which minimizes the risk of wafer damage or contamination. There is a further need in the art for a wafer storage pod which is readily accessible, so as to be ergonomically accommodating, to operators loading and unloading work-in-process in a processing tool. There is a still further need in the art for a work-in-process storage container which is ergonomically accommodating to operators transporting the container and loading and unloading work-in-process in the container.

SUMMARY OF THE INVENTION

The invention therefore provides an improved machine for performing a manufacturing process on a workpiece. The machine includes a cabinet defining an interior workspace for performing the manufacturing process. The workpiece is placed in the workspace by an operator and the cabinet is coupled with a gas source for receiving a flow of gas from the gas source. The improvement comprises a first aperture in the cabinet providing access to an interior chamber within the cabinet. The interior chamber has an interior surface and an open end aligned with the first aperture for storing a work-in-process unit. The interior chamber is accessible to the operator for transferring the work-in-process unit between the interior chamber and the workspace. The improvement further comprises a second aperture in the interior surface of the interior chamber, the second aperture admitting the flow of gas from the gas source to establish a laminar flow of the gas in the chamber between the second aperture and the first aperture.

The invention further provides an improved semiconductor processing apparatus for processing a plurality of semiconductor wafers. The apparatus includes a cabinet defining an interior workspace for performing the processing. The plurality of wafers are placed in the workspace by an operator and the cabinet is coupled with a gas duct which provides gas (such as filtered air) to the apparatus. The improvement comprises a first aperture in the cabinet providing access to an interior chamber within the cabinet. The interior chamber has an interior surface and an open end aligned with the first aperture for storing a work-in-process unit. The interior chamber is accessible to the operator for transferring the work-in-process unit between the interior chamber and the workspace. The improvement further comprises a second aperture in the interior surface of the interior chamber. The second aperture admits the flow of gas from the gas duct to establish a laminar flow of the gas in the chamber between the second aperture and the first aperture.

It is therefore an advantage of the present invention to provide a work-in-process storage area which is readily accessible to an operator of a machine for processing the work-in-process.

It is a further advantage of the present invention to provide a work-in-process storage area which minimizes the risk of damage or contamination to the work-in-process.

It is a still further advantage of the present invention to provide a work-in-process storage area which is inexpensive to implement.

Further objects and features of the present invention will be apparent from the following specification and claims when considered in connection with the accompanying drawings illustrating the preferred embodiment of the invention.

DETAILED DESCRIPTION OF THE DRAWINGS

DETAILED DESCRIPTION OF THE PREFERRED EMBODIMENT

Figure 1:
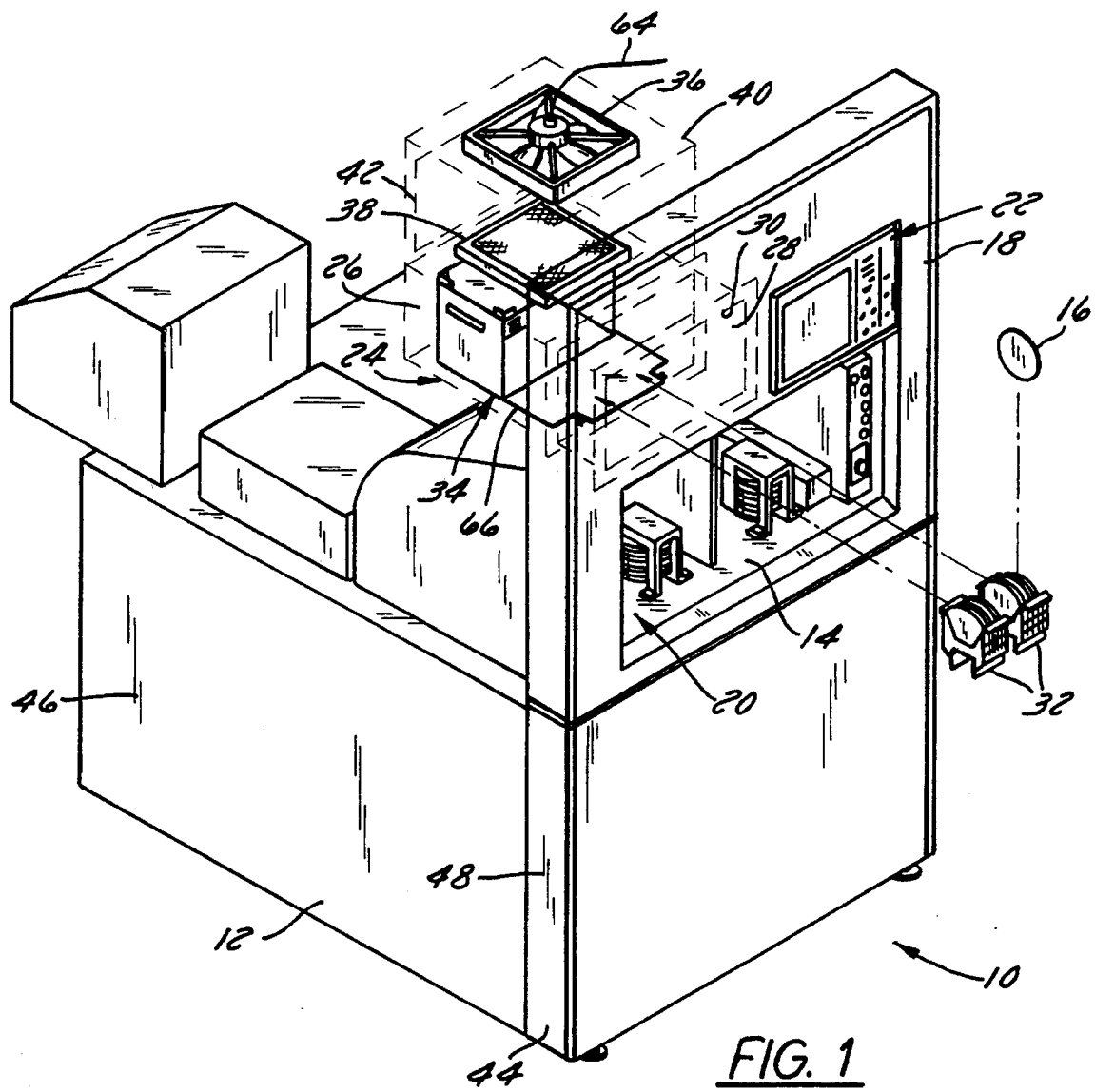
FIG. 1 is a perspective view of a tool for performing a manufacturing process on a workpiece in which the present invention may be used to advantage.

FIG. 1 is a perspective view of a machine or tool 10 for performing a manufacturing process on a workpiece in which the present invention may be used to advantage. The tool 10 includes a cabinet 12 which defines a workspace 14. The tool 10 may be processing equipment for performing a manufacturing step on a workpiece such as a semiconductor wafer 16. For example, the tool 10 may be an etcher such as the Rainbow 4500 etcher produced by Lam Research Corporation. However, the tool 10 could also be another item of semiconductor processing equipment, such as a furnace, or an ion implanter, or an inspection station, or any other equipment for manufacturing a workpiece.

The tool 10 further includes a front panel 18 having an aperture 20 for providing access to the workspace 14. The front panel 18 further includes a control panel 22 for providing control of the operation of the tool 10. An operator of the tool 10 may sit or stand near the tool 10 and place a workpiece such as wafer cassettes 32, in the workspace 14 and operate the control panel 22.

The tool 10 further includes a storage pod 24. The storage pod 24 defines an interior chamber 26, the interior chamber 26 having an open end 28. The open end 28 preferably aligns with an aperture 30 in the front panel 18. As illustrated in FIG. 1, the interior chamber 26 is adapted to receive a storage container such as wafer cassette box 34.

The wafer cassette box 34 is preferably adapted to contain one or more wafer cassettes 32. The wafer cassettes 32 are preferably adapted to contain a plurality of semiconductor wafers such as wafer 16. The wafer cassette box 34 may be readily removed from the interior chamber 26 by an operator. The interior chamber 26 thus stores a work-in-process unit, such as the wafer 16, one or more wafer cassettes 32 containing a plurality of wafers such as wafer 16, or a wafer cassette box 34 configured to hold one or more wafer cassettes 32.

It will be noted from FIG. 1 that the storage pod 24 is situated to provide convenient access for an operator. Work-in-process such as wafer 16, wafer cassettes 32 or wafer cassette box 34 may be easily loaded into the interior chamber 26 or removed from the interior chamber 26. An operator need take no steps away from the tool 10 when moving work-in-process between the workspace 14 and the storage pod 24. Moreover, the open end 28 of the storage pod 24 is preferably at a height approximately equal to the height of the control panel 22, assuring that work-in-process stored in the storage pod 24 is within easy reach of the operator. The storage pod is thus ergonomically accommodating to the operator.

In the preferred embodiment, the storage pod 24 further includes a fan 36 and a filter 38 mounted in a filter box 40. The filter box 40 preferably includes an access door 42 for providing access to the filter 38. A more detailed description of the storage pod 24 will be provided in conjunction with FIGS. 2–4.

In one application of the tool 10, a first portion 44 of the cabinet 12 is preferably located within a controlled environment, such as a class 10 clean room. A second portion 46 of the cabinet 12, which may contain operating equipment such as motors, fans or compressors, is preferably located outside the controlled environment. A wall (not shown) contains the controlled environment and includes an aperture (not shown) into which first portion 44 of cabinet 12 fits. A device such as a gasket (not shown) substantially seals the aperture between the wall and the perimeter 48 of first portion 44 of cabinet 12.

In this manner, the clean room is maintained free of particulates and other contamination which may originate in the operating equipment of the tool 10, and the operating equipment remains outside the clean room. Only areas, such as the workspace 14 and the control panel 22, which are maintained substantially free of contaminants, are exposed to the controlled environment of the clean room. In this manner, the clean room is isolated from contaminant-producing portions (e.g., the operating equipment) of the tool 10.

The second portion 46 of the cabinet 12 may be located in a duct or raceway to which filtered air or other gas, such as nitrogen, is provided. Filtering the air provided to the duct further reduces particulates and other sources of contamination which may come in the vicinity of the clean room. The operating equipment of the tool 10, contained in the cabinet 12, may be accessed for operations such as maintenance from the duct or raceway, again keeping contaminants out of the clean room and in the duct. Thus, the access door 42 of the filter box 40 allows access to the filter 38 to replace the filter 38 from the duct, rather than from the clean room. Particulate matter trapped in the filter 38 thus never enters the clean room.

The fan 36 preferably maintains a laminar flow of air from the duct, through the filter box 40 and the interior chamber 26, and out the open end 28. The duct thus serves as a gas source for the laminar flow of air. If implemented in the application described above, wherein the second portion 46 of the cabinet 12 is located outside a clean room, the filter box 40 and interior chamber 26 are also located outside the clean room. The fan 36 maintains a flow of air from outside the clean room through the interior chamber and into the clean room. Air in the duct which contains the second portion 46 of the cabinet 12 and the filter box 40 is preferably filtered to a predetermined atmospheric purity, such as class 100. This air is again filtered by the filter 38 to a preferably higher degree of atmospheric purity, such as class 1. It is this very pure air which flows through the interior chamber 26, around the workpiece such as the semiconductor wafers 16 and out the open end 28 into the clean room. Thus, the laminar flow of air establishes a predetermined atmospheric purity within the interior chamber 26. In addition, the positive flow of air from the interior chamber 26 out the open end 28 prevents particulates and other contaminants in the air in the clean room from entering the interior chamber 26.

Alternatively, the fan 36 could draw air from the interior chamber 26. Thus, the fan would maintain a laminar flow of air from the open end 28, through the interior chamber 26 and the (optional) filter box 40 and into the duct. Such an air flow would maintain an atmospheric purity in the interior chamber 26 comparable to the atmospheric purity of the clean room.

Figure 2:
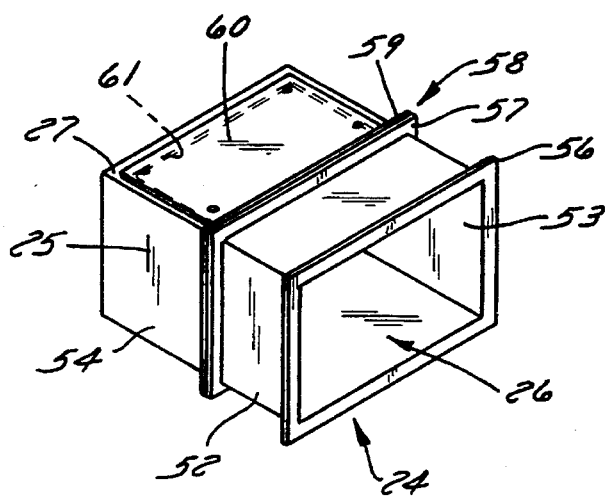
FIG. 2 is a perspective view of the preferred embodiment of a storage pod for use with the tool of FIG. 1 and embodying the present invention.

FIG. 2 is a perspective view of the preferred embodiment of a storage pod 24 for use with the tool 10 of FIG. 1 and embodying the present invention. As illustrated in FIG. 2, the storage pod 24 comprises a plurality of walls 25, 27. However, as will be understood by those ordinarily skilled in the art, the storage pod 24 could include rounded surfaces, for example if the storage pod was extruded from a single sheet of material such as stainless steel.

The storage pod 24 preferably includes a first portion 52 and a second portion 54 defining the interior chamber 26. The first portion 52 preferably terminates in a first flange 56 and a second flange 57. The second portion 54 preferably terminates in a third flange 59. The second flange 57 and the third flange 59 are preferably mated, forming a joint 58 between portions 52, 54. The first flange 56, the second flange 57 and the third flange 59 provide support when the storage pod 24 is mounted to the tool 10. In addition, the joint 58 between first flange 56 and the second flange 57, which is preferably located behind the tool 10 in the duct, provide a substantially airtight seal to keep particulates and other contamination from entering either the interior chamber 26 or the clean room from the duct. The first flange 56 and the second flange 57 may mate with a gasket or other sealing device.

The second portion 54 of the storage pod 24 preferably includes a removable panel 60. The panel 60 may be removed to reveal an aperture 61 in the interior surface 53, between the duct and the interior chamber 26. The panel 60 may be removed to allow the optional filter box 40, including filter 38 and fan 36 (FIG. 1), to be mounted to the storage pod 24 to establish a laminar flow of air through the interior chamber 26.

Figure 3A:
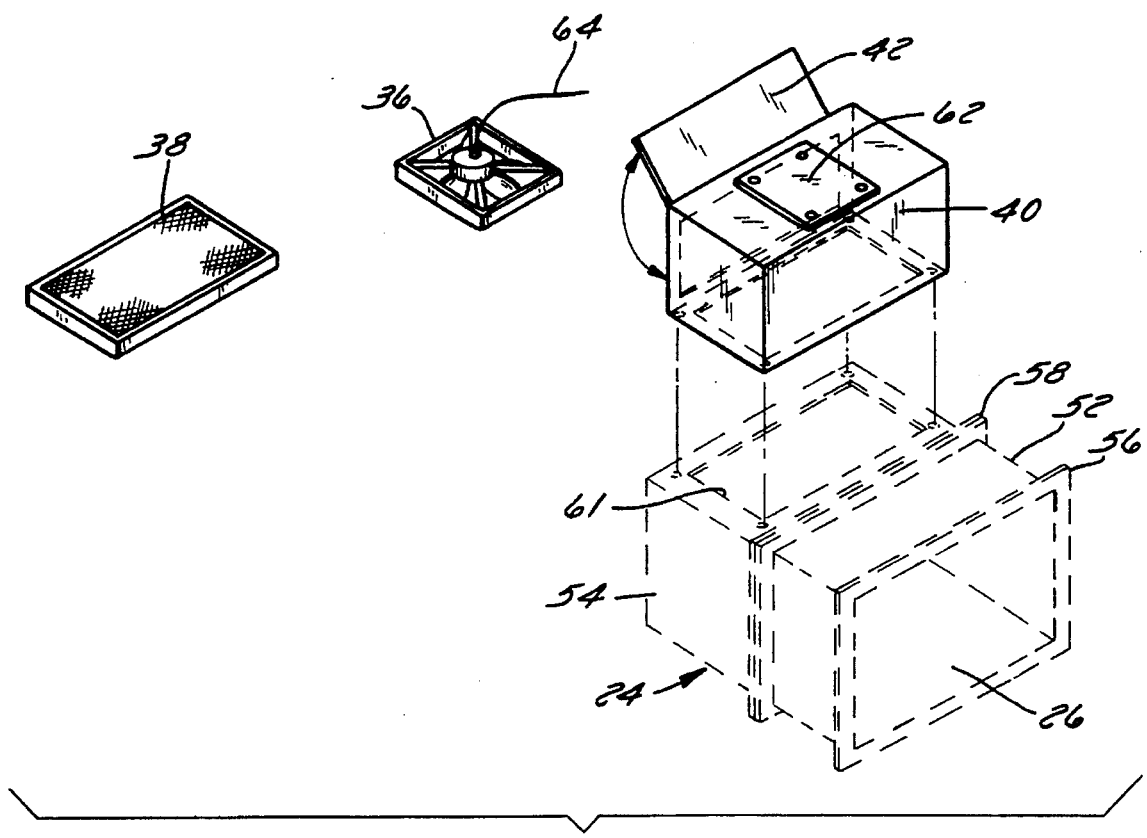
FIG. 3A is a perspective exploded view of an alternative embodiment of a storage pod for use with the tool of FIG. 1 and embodying the present invention.
Figure 3B:
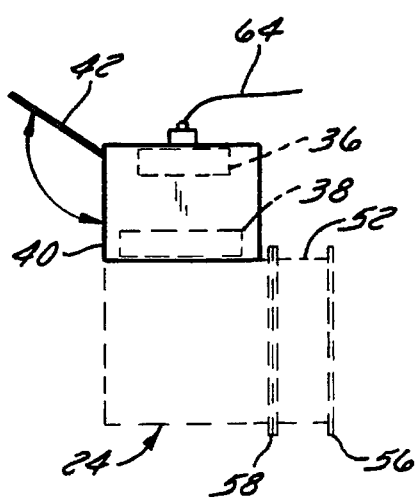
FIG. 3B is a side elevation view of the storage pod of FIG. 3A.
Figure 3C:
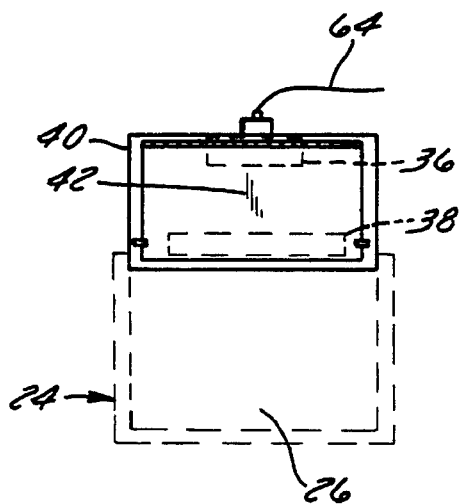
FIG. 3C is a back elevation view of the storage pod of FIG. 3A.

FIG. 3A is a perspective exploded view of an alternative embodiment of a storage pod 24 for use with the tool of FIG. 1 and embodying the present invention. FIG. 3B is a side elevation view of the storage pod 24 of FIG. 3A. FIG. 3C is a back elevation view of the storage pod 24 of FIG. 3A. In particular, FIG. 3A shows that the filter box 40 includes a removable panel 62 to accommodate installation of the fan 36. Also, the fan 36 includes a power cord 64 for providing electrical power to operate the fan. Both the filter box 40 and the storage pod 24 are preferably fabricated from stainless steel. Stainless steel is preferred because it is a material which is easily kept clean, it is non-porous, and it does not generate particles or other contaminants. The filter 38 is preferably a high-efficiency particulate air (HEPA) filter, and preferably filters particles having a diameter greater than 0.2 μm.

Figure 4A:
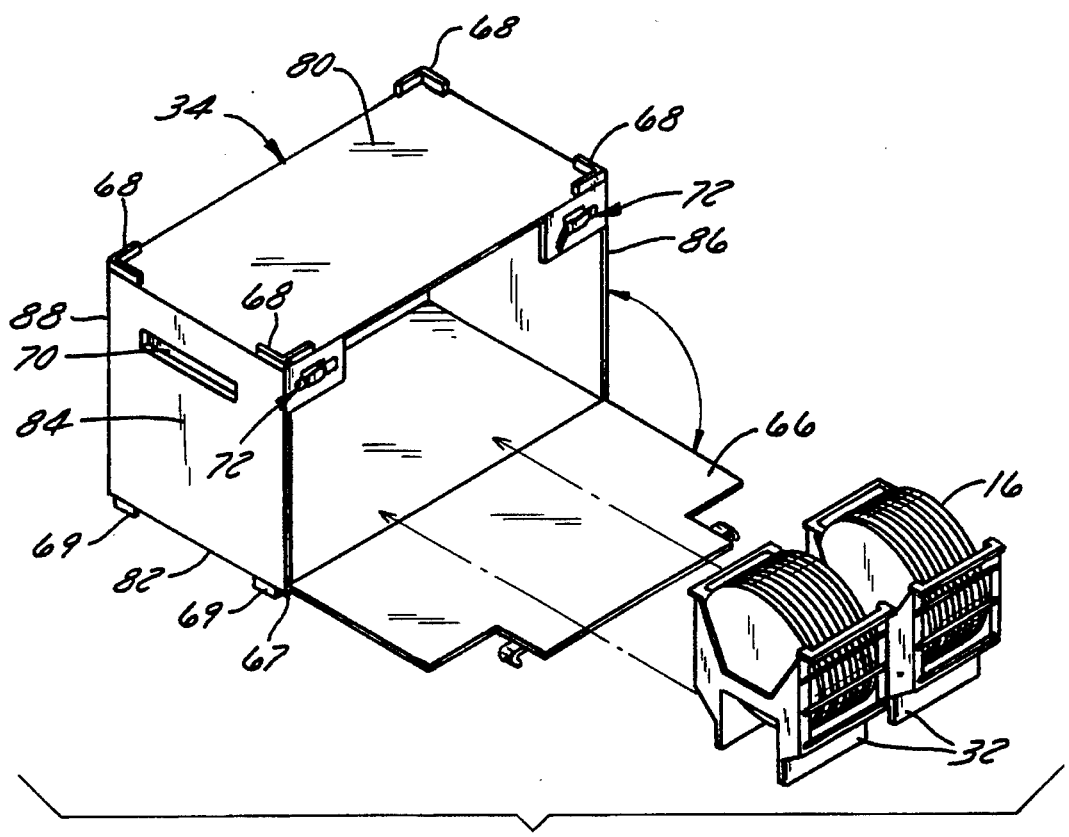
FIG. 4A is a perspective view of a work-in-process storage container for use in conjunction with the storage pod of FIG. 1.
Figure 4B:
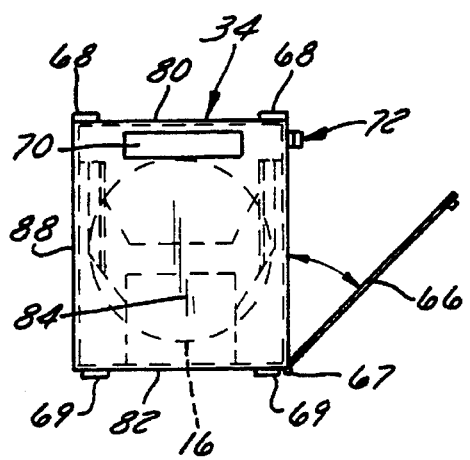
FIG. 4B is a side elevation view of the storage container of FIG. 4A.
Figure 4C:
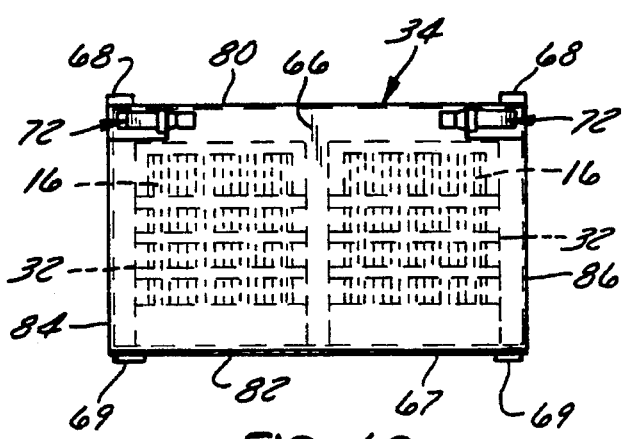
FIG. 4C is a front elevation view of the storage container of FIG. 4A.

FIG. 4A is a perspective view of a work-in-process storage container for use in conjunction with the storage pod of FIG. 1. FIG. 4B is a side elevation view of the storage container of FIG. 4A. FIG. 4C is a front elevation view of the storage container of FIG. 4A. As is illustrated in FIGS. 4A–B, the wafer cassette box 34 preferably has a hinged front door 66 which opens to receive one or more wafer cassettes 32 holding a plurality of semiconductor wafers such as wafer 16. The front door 66 is preferably hinged at the bottom front edge 67 of the container 34. This allows the front door 66 to be opened to an open position (illustrated in FIG. 4A) freeing both hands of an operator for loading or unloading wafers such as wafer 16 or wafer cassettes 32. The ability to use both hands improves the operator's grip on the wafers or wafer cassette 32 and helps minimize the possibility of damage to the wafers.

As can be seen from FIG. 4B, the wafer cassette box 34 is preferably sized to hold the work-in-process, such as the wafers 16, or the wafer cassettes 32, in a position which minimizes the mobility of the wafers 16 or the wafer cassettes 32 within the wafer cassette box 34. This minimizes the opportunity for damage to the work-in-process due to jostling or dropping of the wafer cassette box 34. The wafer cassette box preferably includes one or more latches 72 for securely holding the door 66 in a closed position (illustrated in FIG. 4C).

The wafer cassette box also preferably includes a plurality of stops 68 at the corners of the top 80 of the wafer cassette box 34, and a like plurality of stops 69 at the corners of the bottom 82 of the wafer cassette box 34. Preferably, the stops 68 on the top 80 of a first wafer cassette box such as wafer cassette box 34, mate and interlock with the stops 69 on the bottom 82 of a second wafer cassette box. The stops 68, 69 thus allow a plurality of wafer cassette boxes such as wafer cassette box 34 to be securely stacked one on top of another. The stops 68, 69 preferably interlock to prevent the first wafer cassette box from moving horizontally relative to the second wafer box. FIGS. 4A–4C illustrate the stops 68, 69 as comprising raised ridges on the top 80 and bottom 82 of the wafer cassette box 34. However, the stops 68, 69 could be any means for limiting horizontal movement of a first wafer cassette box stacked atop a second wafer cassette box, such as for example, hook and loop fasteners on the top 80 and bottom 82 or extensions from the sides 84, 86 or the front door 66 or back 88 of the wafer cassette box 34.

The wafer cassette box 34 preferably includes grips 70 on sides 84, 86. The grips 70 may be handles or brackets which are raised from the surface of the sides 84, 86. However, the grips 70 are preferably recessed, in the form of grooves or slots deep enough to be positively engaged by the fingertips of an operator or by a carrying tool. Since they do not protrude from the sides 84, 86, recessed grips minimize the storage area required for the wafer cassette box 34 and reduce the likelihood of the grips 70 interfering with other equipment. The grips 70 are preferably included on both sides 84, 86 to allow an operator to transport the wafer cassette box 34 with both hands, but would be included on the front door 66 or the back 88. The wafer cassette box 34 preferably includes at least two grips on opposing sides of the wafer cassette box 34. This minimizes the likelihood of dropping the wafer cassette box 34, and damaging the wafers 16. This also allows the operator to maintain an ergonomically comfortable posture when transporting the wafer cassette box 34.

Referring again to FIG. 1, the wafer cassette box 34 is preferably sized to fit in the interior chamber 26. Since the front door 66 (FIG. 4A) of the wafer cassette box opens from the front and lays flat, an operator located in front of the tool 10 may comfortably remove or insert work-in-process such as wafer cassette 32 or wafers 16 in the wafer storage box 34. Since the grips 70 (FIG. 4A) are recessed, the grips do not engage or otherwise interfere with the interior chamber 26 on the open end 28 when the wafer cassette box 34 is inserted in or removed from the interior chamber 26.

As can be seen from the foregoing, the present invention provides a work-in-process storage pod. Work-in-process is stored in a location that is readily and ergonomically accessible to an operator of a tool. The storage pod is configured for storing work-in-process so as to minimize damage to or contamination of work-in-process materials. The present invention further provides a work-in-process storage container having a front panel which may be opened for storing or removing work-in-process within the storage container. The container includes grips on its sides for two-handed transport of the container, minimizing the risk of damage to the work-in-process and improving operator comfort.

It is to be understood that, while the detailed drawings and specific examples given describe preferred embodiments of the invention, they are for the purpose of illustration only, that the apparatus of the invention is not limited to the precise details and conditions disclosed, and that various changes may be made therein without departing from the spirit of the invention which is defined by the following claims.

We claim:

1. An improved machine for performing a manufacturing process on a workpiece, the machine including a cabinet defining an interior work space for performing said manufacturing process, said workpiece being placed in said work space by an operator, said cabinet being coupled with a gas source for receiving a flow of gas from said gas source, said cabinet including a front panel, wherein the improvement comprises:

a first aperture in said front panel of said cabinet providing access to an interior chamber within said cabinet, said interior chamber having an interior surface and an open end aligned with said first aperture for storing a work-in-process unit, said interior chamber being accessible to said operator for transferring said work-in-process unit between said interior chamber and said work space;

a second aperture in said interior surface of said interior chamber, said second aperture admitting said flow of gas from said gas source to establish a laminar flow of said gas in said chamber intermediate said second aperture and said first aperture; and a third aperture in said front panel of said cabinet providing access to said work space.

2. An improved machine for performing a manufacturing process on a workpiece as recited in claim 1 wherein said laminar flow of said gas establishes at least a class 100 atmospheric purity within said chamber.

3. An improved machine for performing a manufacturing process on a workpiece as recited in claim 1 wherein the improvement further comprises filter means attached to said second aperture for filtering said flow of gas from said gas source.

4. An improved machine for performing a manufacturing process on a workpiece as recited in claim 3 wherein the improvement further comprises fan means attached to said second aperture for regulating said laminar flow of said gas.

5. An improved semiconductor processing apparatus for processing a plurality of semiconductor wafers, the apparatus including a cabinet defining an interior work space for performing said processing, said plurality of wafers being placed in said work space by an operator, said cabinet being coupled with a gas duct, said gas duct providing gas to the apparatus, said cabinet including a front panel, wherein the improvement comprises:

a first aperture in said front panel of said cabinet providing access to an interior chamber within said cabinet, said interior chamber having an interior surface and an open end aligned with said first aperture for storing a work-in-process unit, said interior chamber being accessible to said operator for transferring said work-in-process unit between said interior chamber and said work space;

a second aperture in said interior surface of said interior chamber, said second aperture admitting said flow of gas from said gas duct to establish a laminar flow of said gas in said chamber intermediate said second aperture and said first aperture; and a third aperture in said front panel providing access to said interior work space.

6. An improved semiconductor processing apparatus for processing a plurality of semiconductor wafers as recited in claim 5 wherein said laminar flow of said gas establishes at least a class 100 atmospheric purity within said chamber.

7. An improved semiconductor processing apparatus for processing a plurality of semiconductor wafers as recited in claim 5 wherein the improvement further comprises filter means attached to said second aperture for filtering said flow of gas from said gas duct.

8. An improved semiconductor processing apparatus for processing a plurality of semiconductor wafers as recited in claim 7 wherein the improvement further comprises fan means attached to said second aperture for regulating said laminar flow of said gas.

* * * * *